(12) United States Patent
Kanaya et al.

(10) Patent No.: US 7,488,676 B2
(45) Date of Patent: Feb. 10, 2009

(54) MANUFACTURING METHOD OF A MULTI-LAYERED CIRCUIT BOARD

(75) Inventors: Yasuhiko Kanaya, Ebina (JP); Akira Irie, Ebina (JP); Katsuhiro Nagasawa, Ebina (JP); Toru Yuki, Ebina (JP)

(73) Assignee: Hitachi Via Mechanics, Ltd., Kanagawa (JP)

( * ) Notice: Subject to any disclaimer, the term of this patent is extended or adjusted under 35 U.S.C. 154(b) by 38 days.

(21) Appl. No.: 11/297,358

(22) Filed: Dec. 9, 2005

(65) Prior Publication Data

US 2006/0127652 A1 Jun. 15, 2006

(30) Foreign Application Priority Data

Dec. 10, 2004 (JP) ............................ 2004-359169

(51) Int. Cl.
H01L 21/4763 (2006.01)
(52) U.S. Cl. ...................................... 438/618; 438/622
(58) Field of Classification Search .................. 438/618, 438/622, 624, 637, 639, 666–668, E21.44
See application file for complete search history.

(56) References Cited

U.S. PATENT DOCUMENTS 6,184,133 B1 * 2/2001 Iijima et al. ................. 438/667
6,562,709 B1 * 5/2003 Lin ............................. 438/618
6,998,705 B2 * 2/2006 Noguchi ...................... 257/701
7,096,555 B2 8/2006 Tourne et al.
2005/0128672 A1 6/2005 Tourne et al.

FOREIGN PATENT DOCUMENTS

JP 2001-341052 12/2001
JP 2004-063771 2/2004

* cited by examiner

*Primary Examiner*—Theresa T. Doan
(74) *Attorney, Agent, or Firm*—Wenderoth, Lind & Ponack, L.L.P.

(57) ABSTRACT

A manufacturing method of a multi-layered circuit board allows electronic parts to be mounted adequately and will not hamper performance of the electronic parts. A power terminal (pin) of an electronic part to be mounted on a surface of the multi-layered circuit board is inserted into a plated through hole to connect with a first conductive layer. A detecting section having a detecting hole which is formed coaxially with the through hole and whose diameter is larger than the through hole is provided on a second conductive layer on the back of the first conductive layer. A hole having a large diameter is formed by a tool along the through hole from the back while applying voltage between the second conductive layer and the tool. The depth of the hole is set based on the tool electrically conducting with the detecting hole. Unnecessary plate of the through hole may be removed by the large hole.

3 Claims, 4 Drawing Sheets

MANUFACTURING METHOD OF A MULTI-LAYERED CIRCUIT BOARD

FIELD OF THE INVENTION

The present invention relates to a multi-layered circuit board formed by overlying a plurality of substrates composed of conductive layers and insulating layers in a body and to a manufacturing method of the multi-layered circuit board.

BACKGROUND ART

Conventionally, for the purpose of drilling a hole through a multi-layered circuit board, there has been a technology of detecting the surface height of a spot to be machined and of drilling the hole to a specified depth based on the detected height as disclosed in Japanese Patent Laid-Open No. 2001-341052. This improves precision of the depth of the hole to be machined. However, because the thickness of the multi-layered circuit board varies, it was not always possible by this method to steadily form a blind hole for connecting upper and lower conductive layers.

Then, there has been provided a technology of providing a measuring area in each of the laminated conductive layers in advance, of exposing each measuring area before drilling a hole and of drilling the hole while confirming position of a tool in the height direction as disclosed in Japanese Patent Laid-Open No. 2004-63771. It allowed the blind hole for connecting upper and lower conductive layers to be steadily formed.

By the way, a power terminal (power pin), e.g., a pin, of an electronic part such as an IC package is connected with a desirable conductive layer as follows in mounting the IC package on the multi-layered circuit board. That is, a hole that reaches to the desirable conductive layer is drilled from the surface of the multi-layered substrate and plating is carried out to form a plating layer on an inner face of the hole. Then, the power terminal (pin) or the like is inserted into the hole and soldering is carried out to electrically connect the power terminal (pin) with the desirable conductive layer through an intermediary of the plated hole.

FIG. 4 is a section view of a conventional multi-layered circuit board.

The multi-layered circuit board 1 shown in the figure is formed as follows. That is, the multi-layered circuit board 1 is formed by laminating a third substrate 2 composed of a conductive layer $2a$ and an insulating layer $2b$ combined from each other, a second substrate 3 composed of conductive layers $3a$ and $3c$ and an insulating layer $3b$ combined from each other, a first substrate 4 composed of a conductive layer $4a$ and an insulating layer $4b$ combined from each other and a surface substrate 5 composed of a conductive layer $5a$ and an insulating layer $5b$ combined with each other in order by means of adhesive and by combining them with each other through heat treatment. Here, although circuit patterns are formed on the conductive layers $3a$, $3c$ and $4a$, i.e., the inner laminated layers, there are cases when circuit patterns are formed and when no circuit pattern is formed on the surface conductive layers $5a$ and the back conductive layer $2a$. In the case of the second substrate 3, the conductive layer $3a$ is electrically connected with the conductive layer $3c'$ through the intermediary of a plating layer 7 formed on a connecting hole 6 by plating.

Next, a hole 8 for connecting a power terminal of electronic parts, such as a pin, with a desirable conductive layer (the first conductive layer $4a$ in case of FIG. 4) is drilled from the side for mounting the electronic part such as an IC package (referred to as a surface side hereinafter). Still more, a connecting hole for connecting the surface conductive layer $5a$ and/or the back conductive layer $2a$ with the inner conductive layers $3a$ and $3c$ is drilled as necessary.

Then, a plating layer 9 is formed by plating the inner part of the power feeding connecting hole (not shown in FIG. 4) connecting the surface conductive layer $5a$ and/or the back conductive layer $2a$ with the inner conductive layers $3a$ and $3c$ immediately when the circuit patterns are formed on the conductive layer $5a$ on the surface side and on the conductive layer $2a$ on the back side opposite from the surface side or after forming the circuit patterns by etching when no circuit pattern is formed on the conductive layers $5a$ and $2a$.

Although the plating is normally carried out under sufficient control, there is a case when a thickness of the plating layer 9 at the bottom of the hole 8 becomes too thick or when a diameter of the plating layer 9 at the bottom of the hole 8 becomes small as compared to that at the entrance side as shown in the figure. When the plating layer 9 is formed, an end of the power terminal cannot be inserted to a desired depth and the electronic part comes up above the surface of the multi-layered circuit board 1. If the electronic part comes up above the multi-layered circuit board, the power terminal (pin) is apt to be damaged due to vibration and the like, reducing its reliability. Still more, there arises such a problem that if the external dimension of the multi-layered circuit board as a product incorporating electronic parts becomes large, it may not be stored within an electronic apparatus using the multi-layered circuit board.

In such a case, it is conceivable to avoid the dispersion or partial increase of the thickness of the plating layer by forming the hole 8 as a through hole. However, if this through hole is formed close to the circuit pattern on the back side, there is a case when the electronic part causes erroneous operation due to noise as a result of electro-magnetic effect that is caused by either one of them to the other. Accordingly, it is necessary to remove the unnecessary plating layer after plating when the hole 8 for positioning the power terminal is formed as the through hole.

However, it is not possible to remove the unnecessary plating layer accurately by the technology of Japanese Patent Laid-Open No. 2004-63771 because a tool electrically conducts with the desired conductive layer via the plating layer in removing the unnecessary plating layer.

Accordingly, it is an object of the invention to provide a multi-layered circuit board and a manufacturing method of the multi-layered circuit board that enables electronic parts to be adequately mounted and that will not hamper performance of the electronic parts.

SUMMARY OF THE INVENTION

In order to solve the above-mentioned problem, according to a first aspect of the invention, there is provided a multi-layered circuit board formed by laminating and combining a plurality of substrates composed of conductive layers and insulating layers, having a through hole that penetrates through from the surface of the multi-layered circuit board to the back face thereof while contacting with a surface conductive layer disposed on the surface of a substrate positioned on the surface and with a first conductive layer located under and inside of the surface conductive layer. An electrically conductive plating layer is plated on an inner peripheral face of the through hole to electrically connect the surface conductive layer with the first conductive layer. A detecting section is disposed on a second conductive layer located on the side of the back face from the first conductive layer and has a detecting hole which is formed coaxially with the through hole whose diameter is larger than the diameter of the through hole and a large hole whose diameter is larger than the diameter of the through hole which is formed from the back face to at least the second conductive layer along the through hole coaxially with the through hole. Part of the detecting hole of the detecting section is exposed to the large hole by forming the large hole.

Because the connecting hole for connecting the power terminal of the electronic part is formed as a plated through hole and the hole reaching to the detecting hole is formed along the through hole from the back of the multi-layered circuit board as described above, the plating layer formed on the through hole may be exactly removed. Thus, it becomes possible to provide a multi-layered circuit board that allows the electronic parts to be adequately mounted and that will not hamper operations of the electronic parts.

As the multi-layered circuit board, one having (a) a through hole that penetrates through from the surface of the multi-layered circuit board to the back face thereof while contacting with a surface conductive layer disposed on the surface of a substrate positioned on the surface and with a first conductive layer located under and inside of the surface conductive layer, (b) an electrically conductive plating layer plated on an inner peripheral face of the through hole and (c) a detecting section disposed on a second conductive layer located on the side of the back face from the first conductive layer and having a detecting hole which is formed coaxially with the through hole whose diameter is larger than the diameter of the through hole (as shown in FIG. 1 for example) is used.

The multi-layered circuit board is an intermediate product and it becomes a multi-layered circuit board in which the large hole is formed in the end (see FIG. 3). Even though it is an intermediate product, it is shipped from a substrate maker as a product and it is fabricated as the final product by a product maker.

Preferably, the first conductive layer is a conductive layer on the side of surface of a second substrate adjacent to the surface substrate having the surface conductive layer; and the second conductive layer is a conductive layer on the side of surface of a third substrate adjacent to the back side of the second substrate.

According to a second aspect of the invention, there is provided a manufacturing method of a multi-layered circuit board formed by laminating a plurality of substrates composed of conductive layers and insulating layers through which a connecting hole for inserting a power terminal of an electronic part to be mounted on the multi-layered circuit board with a first conductive layer on a surface of the multi-layered circuit board is formed. The method forms a detecting section having a detecting hole on a second conductive layer on the side of a back face from the first conductive layer, and forms a through hole that penetrates from the surface to the back face of the multi-layered circuit board while contacting with a surface conductive layer disposed on the surface of a substrate positioned at the surface and with the first conductive layer located inside and without contacting the detecting hole by having a diameter smaller than that of the detecting hole. An inner surface of the through hole is plated and additionally a hole having a large diameter and a predetermined depth based on the detection of the detecting hole is drilled by a tool having a diameter larger than the diameter of the detecting hole along the through hole from the back side of the multi-layered circuit board while applying a predetermined voltage between the tool and the second conductive layer on which the detecting section is provided. The connecting hole is formed by the through hole between the surface conductive layer and the first conductive layer where the plating is left on the inner peripheral face thereof.

Thereby, a multi-layered circuit board that allows electronic parts to be adequately mounted and that will not hamper the operations of the electronic parts may be readily fabricated by forming the hole having a large diameter from the back of the multi-layered circuit board to the predetermined depth accurately along the through hole by the additional step and by accurately removing the unnecessary plating layer while forming the connecting hole for connecting the power terminal of the electronic part as the plated through hole.

The predetermined depth in the additional-step may be a depth determined based on the position of the tool when the voltage becomes a value set in advance or less.

It becomes possible to detect the depth of the hole having the large diameter and drilled by the tool accurately and to form the hole having the large diameter and the predetermined depth steadily by drilling the hole until the voltage applied between the tool and the second conductive layer on which the detecting section is provided becomes a preset value or less.

The manufacturing method of the multi-layered circuit board may further include steps of drilling a detecting through hole at position connected with the second conductive layer having the detecting section beside the connecting through hole and plating the inner face of the detecting through hole. A predetermined voltage is applied between the second conductive layer having the detecting section and the tool through the intermediary of plating of the detecting through hole in the additional step.

The voltage between the second conductive layer having the detecting section and the tool may be readily measured and the hole having the predetermined depth and the large diameter may be readily and accurately formed without requiring machining for exposing the second conductive layer by setting a measuring probe or the like via the plating of the detecting through hole.

DETAILED DESCRIPTION OF THE INVENTION

Figure 1:
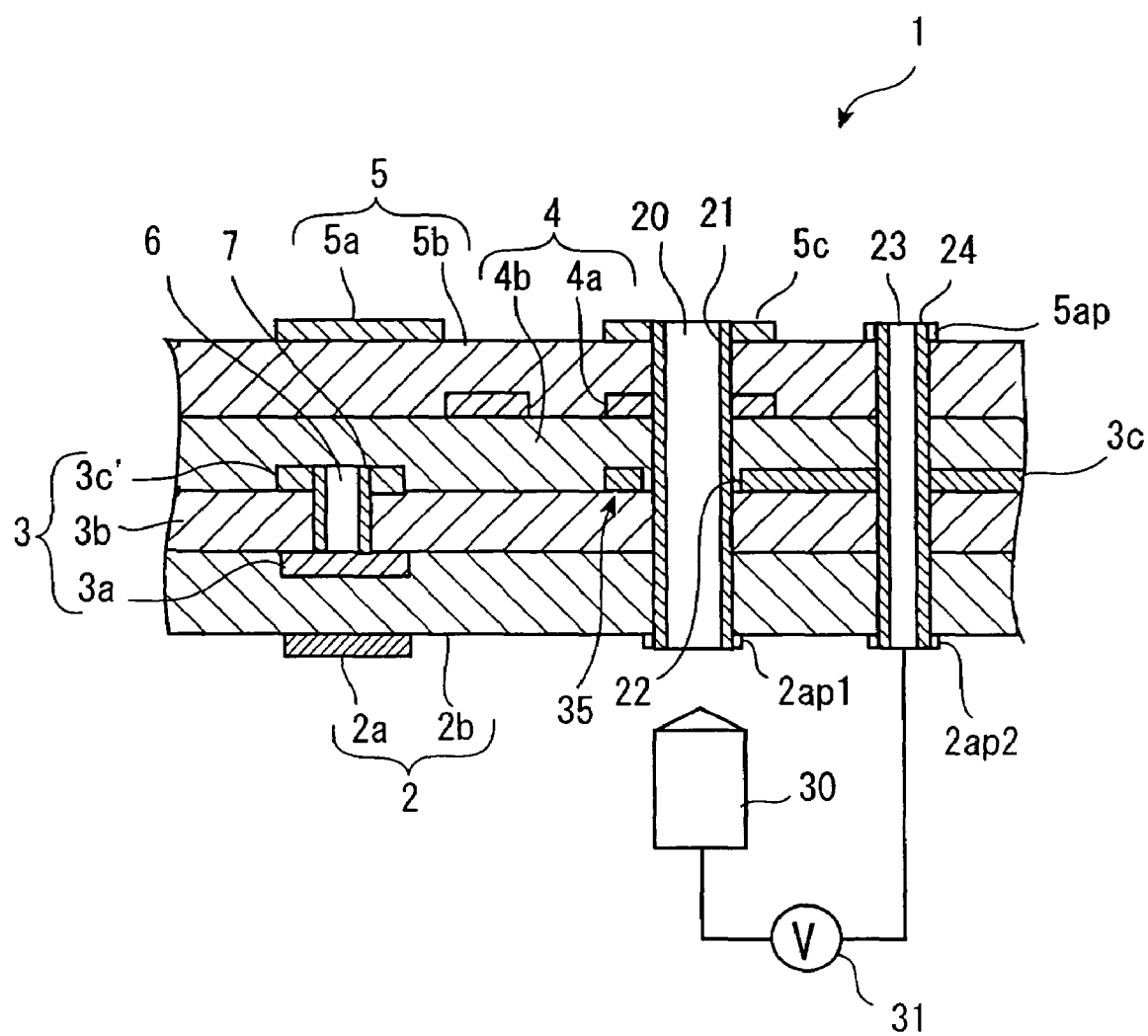
FIG. 1 is a section view of a multi-layered circuit board to which the invention is applied during a machining process.

The invention will now be described based on preferred embodiments shown in the drawings, which are not intended to limit the scope of the invention, but exemplify the invention. All of the features and the combinations thereof described in the embodiments are not necessarily essential to the invention.

Figure 2:
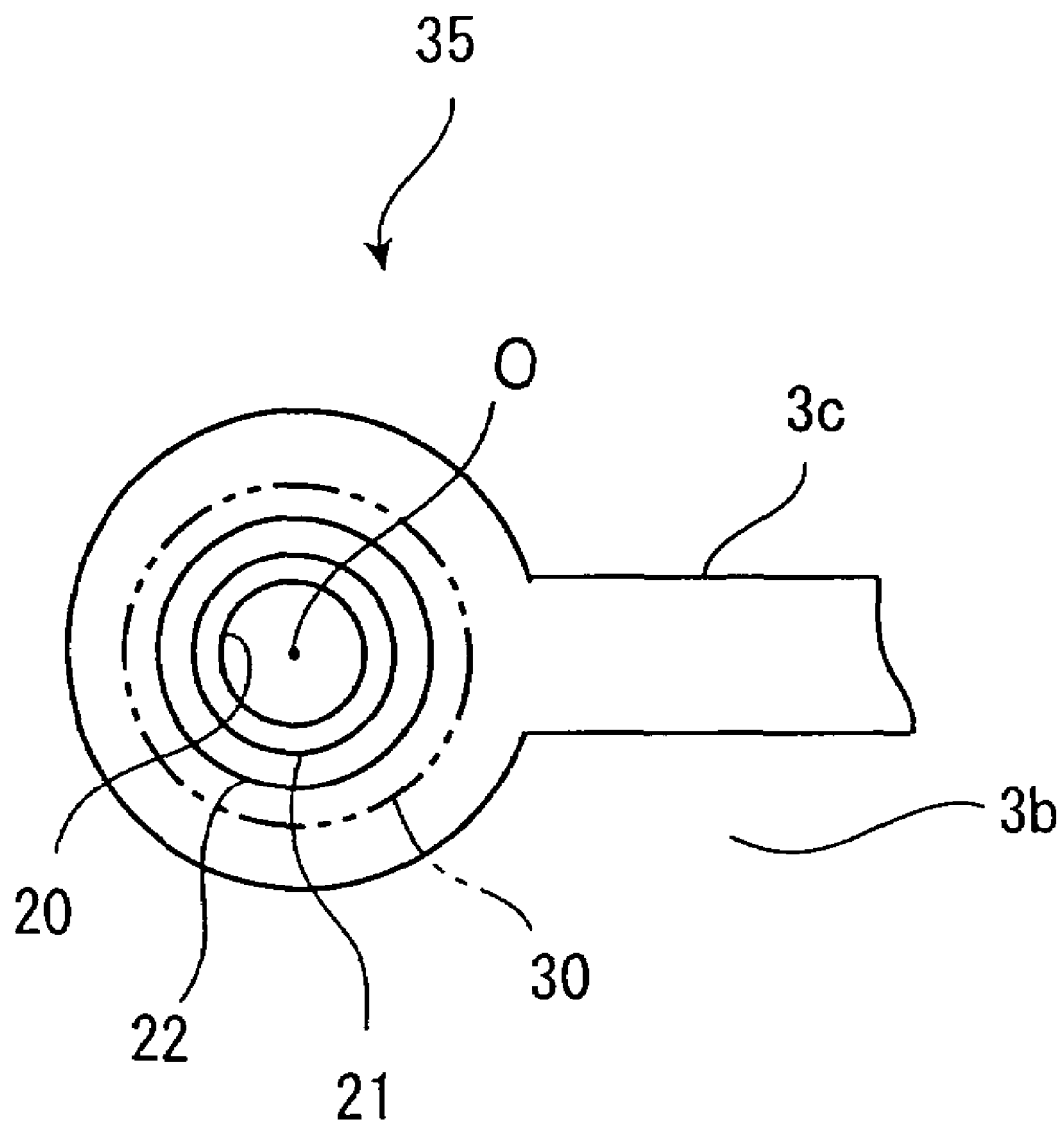
FIG. 2 is a plan view of an inventive substrate on which a detecting section is provided.
Figure 3:
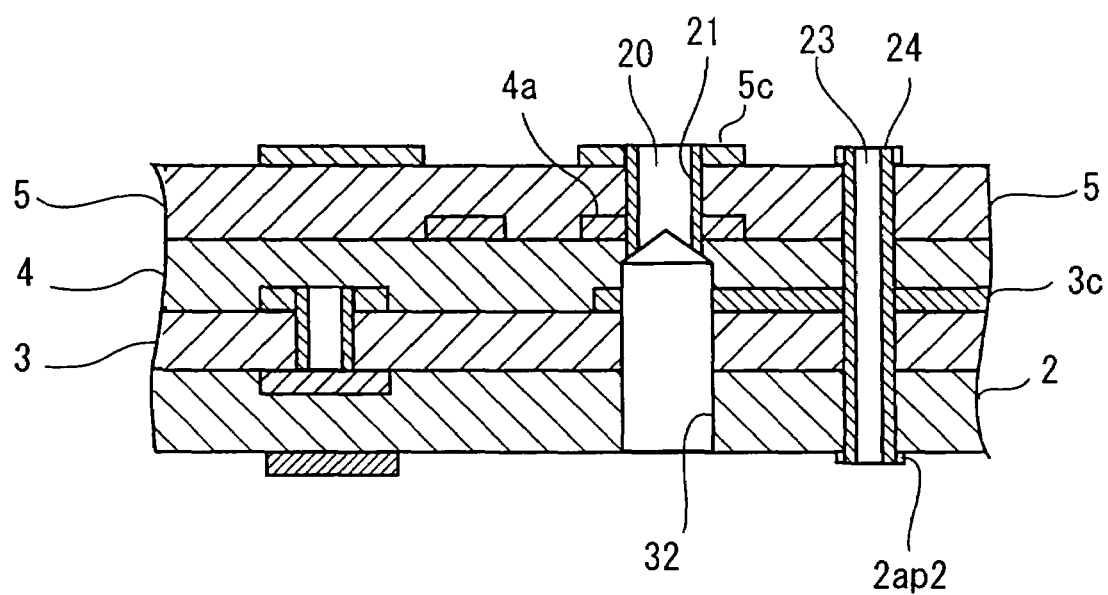
FIG. 3 is a section view of the multi-layered circuit board to which the invention is applied just before mounting an electronic part.

FIG. 1 is a section view of a multi-layered circuit board to which the invention is applied during a machining process, FIG. 2 is a plan view of a substrate on which a detecting section is provided and FIG. 3 is a section view of the multi-layered circuit board to which the invention is applied just before mounting an electronic part. The same parts or the same functions as those in FIG. 4 will be denoted by the same reference numerals and overlapping explanation thereof will be omitted here.

Figure 4:
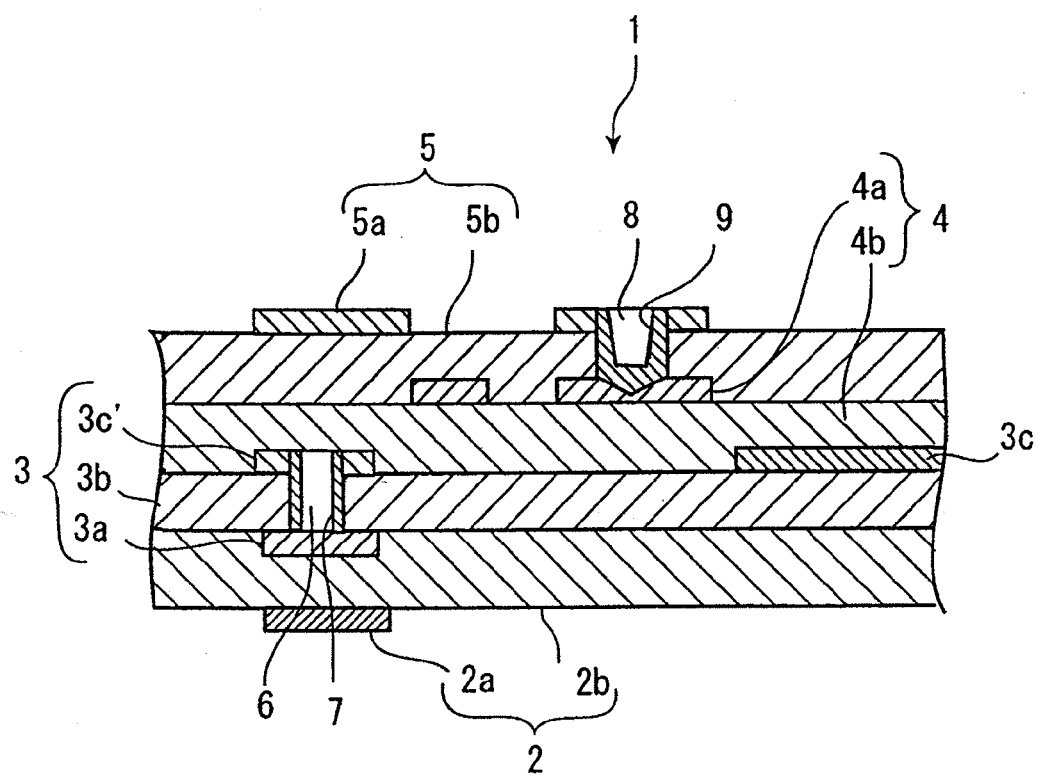
FIG. 4 is a section view of a conventional multi-layered circuit board.

Although the multi-layered substrate shown in FIG. 1 becomes substantially the same as the multi-layered circuit board shown in FIG. 4 at the point of time when it is formed as a product, it is different from the multi-layered circuit board shown in FIG. 4 in that a conventional blind hole (the hole 8 in FIG. 4) for inserting the power terminal is formed as a through hole 20 (diameter thereof is the same with the diameter of the hole 8), that a detecting through hole 23 is newly provided and that pads 2ap1, 2ap2 and 5ap, i.e., conductive layers, are provided. That is, this multi-layered substrate 1 has, in order from the surface side on which electronic parts are mounted, a surface substrate 5, a first substrate 4, a second substrate 3 and a third substrate 2 on the back which are laminated in a body. The surface substrate 5 has a surface conductive layer 5c for a connecting hole formed together with a surface conductive layer 5a for a circuit pattern on the surface of an insulating layer 5b and the first substrate 4 has a first conductive layer 4a formed on the surface side of an insulating layer 4b and connected with the connecting hole. The second substrate 3 has a first conductive layer 3c' and a second conductive layer 3c formed on the surface side of an insulating layer 3b and a conductive layer 3a formed on the back side of the insulating layer 3b. The conductive layers 3c' and 3a are electrically connected with each other by a connecting hole 6 having a plated layer 7. The third substrate 2 has the conductive layer 2a on the back of an insulating layer 2b.

It is noted that the surface conductive layer 5c for the connecting hole may have a circuit pattern formed thereon or may be dedicated for the connecting hole as a pad. It may be also a conductive layer formed by plating described later.

This will be explained in order.

As shown in FIG. 1, a through hole 20 that penetrates from the surface to the back of the multi-layered circuit board 1 is formed in contact with the surface conductive layer 5c and the first conductive layer 4a connected with the connecting hole and its inner peripheral face of the through hole is plated to form a plating layer 21.

As shown in FIG. 2, an axial line of the through hole 20 (the hole 8 in FIG. 4) for positioning the power terminal of the electronic part is assumed to be O. Then, a detecting section 35 having a detecting hole 22 which is coaxial with the axial line O and whose diameter is larger than that of the through hole 20 is formed through the second conductive layer 3c of the substrate 3 which is disposed on the back side of the insulating layer 4b and which is closest to the first conductive layer 4a.

Still more, the pads, i.e., the conductive layers, 2ap1, 2ap2 and 5ap are provided on the surface substrate 5 and the back substrate 2 centering on the axial line of the through hole 20 and on that of a detecting through hole 23 described later as shown in FIG. 1.

Next, steps for fabricating the multi-layered circuit board of the invention will be explained.

Step 1: The connecting through hole 20 for inserting and positioning the power terminal (pin) of the electronic part to be disposed on the surface is drilled. The detecting through hole 23 that is connected with the conductive layer 3c is also drilled. It is noted that the detecting through hole 23 is disposed at either position within the second conductive layer 3c.

Step 2: A plating layer 21 is formed on the inner face of the through hole 20 and a plating layer 24 is formed on the inner face of the detecting through hole 23, respectively, through a plating process.

Step 3: Drilling is carried out from the back side along the through hole 20 (axial line 0) by a tool 30 whose diameter is larger than the diameter of the detecting hole 22 while applying preset voltage, e.g., 5 V, between the tool 30 and the plating layer 24, i.e., the conductive layer 3c. When the voltage between the tool 30 and the conductive layer 3c becomes preset voltage, e.g., 2V, or less, it is judged that the tool 30 has reached to the position of the conductive layer 3c, i.e., in contact with the conductive layer 3c. Then, if the conductive layer 3c is close to the conductive layer 4a for example, the drilling is stopped at that moment. Still more, when the detecting section 35 is disposed on a conductive layer 3a on the back side rather than the conductive layer 3c for example in connection with the disposition of the circuit patterns, the drilling is carried out further by a preset distance from that position.

Because the diameter of the tool 30 is larger than the outer diameter of the plating layer 21, a hole 32 having a large diameter is perforated by the tool 30 from the back surface along the through hole 20 (axial line O) as shown in FIG. 3. The hole 32 is drilled to a depth where the tool 30 electrically conducts with the detecting hole 23 formed through the conductive layer 3c. Accordingly, the plating layer 21 of the through hole 20 is steadily removed up to the lower face of the conductive layer 3c or to the position slightly over the conductive layer 3c where the detecting section 35 is located.

The multi-layered circuit board 1 is fabricated in the same manner with the conventional method hereinbelow.

Step 4: The power terminal (pin) is inserted into the through hole 20 in which the plating layer 21 is formed to position the electronic part.

Step 5: The power terminal is connected with the plating layer 21, i.e., the conductive layer 4a, by means of soldering.

It is noted that when no circuit pattern is formed on the conductive layers 2a and 5a, circuit patterns are formed on the conductive layers 2a and 5a by etching or the like after ending Step 2.

Here, the position of the conductive layer where the detecting section 35 is provided will be explained. It is desirable to dispose the detecting section 35 on the conductive layer closest to the conductive layer to which the power terminal is connected in order to remove the plating layer 21 on the back side accurately from the conductive layer to which the power terminal is connected. However, there is a case when either one of the end of the power terminal and the conductive layer where the detecting section 35 is provided causes an electromagnetic effect on the other. If the detecting section 35 is separated from the conductive layer to which the power terminal is connected in order to prevent the electromagnetic effect on the other hand, it becomes difficult to remove the plating layer 21 accurately because the thickness of the substrate varies depending on the laminating condition. Accordingly, it is desirable to decide the conductive layer in which the detecting section 35 is disposed per product.

It is noted that even if a length of the power terminal (pin) of the electronic part is longer than the depth from the surface to the first conductive layer 4a and has a length reaching to the conductive layer 3c in connecting the power terminal (pin) of the electronic part with the conductive layer 4a for example, the hole 32 perforated by the tool 30 has a diameter considerably larger than that of the plated through hole 20. Therefore, the power terminal inserted into the plating layer 21 will not contact with the conductive layer 3c having the large diameter and will not approach it so as to influence it electromagnetically. Still more, even if a certain amount of the melted solder in Step 5 infiltrates into a narrow gap between the plating layer 21 of the through hole 20 and the power terminal due to a capillary phenomenon, it will not reach to the hole 32 having the large diameter. Further, even if a very small amount of solder reaches to the upper end of the large hole 32, the solder will not reach to the conductive layer 3c because the gap between the power terminal and the large hole is large and the capillary phenomenon stops.

The detecting through hole 23 connected with the conductive layer 3c is provided in the present embodiment so that the conductive layer 3c need not be exposed by drilling, for example, and a measuring probe may be readily set in measuring the voltage between the tool 30 and the conductive layer 3c.

It is noted that the work efficiency may be improved further by providing means for automatically positioning a voltage detecting probe to be contacted with the detecting through hole 23 (the plating layer 24) on a machining table for mounting the multi-layered circuit board 1.

Still more, because the pads 2ap1, 2ap2 and 5ap are provided in the present embodiment, the plating layers 21 and 24 may be steadily formed. It is noted that the pads 2ap1, 2ap2 and 5ap may not be always provided. Further, it is not necessary to provide the detecting through hole 23 if the conductive layer 3c on which the detecting section 35 is provided is electrically conductive by exposing it, for example.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A method of manufacturing a multi-layered circuit board formed by laminating and combining a plurality of substrates composed of conductive layers and insulating layers through which a connecting hole, for inserting a power terminal of an electronic part to be mounted on a surface of the multi-layered circuit board to connect with a first conductive layer, is to be formed, said method comprising:

forming a detecting section having a detecting hole in a second conductive layer, the second conductive layer being positioned toward a back face of the multi-layered circuit board with respect to the first conductive layer;

forming a through hole that penetrates from the surface of the multi-layered circuit board to the back face of the multi-layered circuit board so as to contact with a surface conductive layer disposed on the surface of a surface substrate, which is one of the plurality of substrates, positioned at the surface of the multi-layered circuit board and contact with the first conductive layer, the first conductive layer being located between the surface of the multi-layered circuit board and the back face of the multi-layered circuit board, and without contacting the detecting hole by having a diameter smaller than that of the detecting hole;

plating an inner surface of the through hole;

drilling a hole with a tool having a diameter larger than the diameter of the detecting hole along the through hole from the back side of the multi-layered circuit board while applying a predetermined voltage between the tool and the second conductive layer having the detecting section and to a predetermined depth based on detection of the detecting hole, whereby the connecting hole is formed by the through hole between the surface conductive layer and the first conductive layer where the plating is left on an inner peripheral face of the through hole;

wherein the first conductive layer is on a surface side of a second substrate of the plurality of substrates adjacent to the surface substrate and the second conductive layer is on a surface side of a third substrate adjacent to a back side of the second substrate.

2. The method of claim 1, wherein the predetermined depth is based on the position of the tool when the voltage becomes equal to or less than a predetermined set value.

3. The method of claim 1, and further comprising:

drilling a detecting through hole beside the through hole forming the connecting hole at a position so as to be connected with the second conductive layer having the detecting section; and plating the inner face of the detecting through hole;

wherein the predetermined voltage is applied between the second conducive layer having the detecting section and the tool through the intermediary of the plating of the detecting through hole.

* * * * *